(12) United States Patent
Kimura

(10) Patent No.: US 9,369,123 B2
(45) Date of Patent: Jun. 14, 2016

(54) POWER-ON RESET CIRCUIT

(71) Applicant: Kabushiki Kaisha Toshiba, Minato-ku, Tokyo (JP)

(72) Inventor: Masahiro Kimura, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 14/336,791

(22) Filed: Jul. 21, 2014

(65) Prior Publication Data

US 2015/0236688 A1 Aug. 20, 2015

(30) Foreign Application Priority Data

Feb. 19, 2014 (JP) .................................. 2014-29151

(51) Int. Cl.
*H03L 7/00* (2006.01)
*H03K 17/22* (2006.01)
*G06F 1/24* (2006.01)

(52) U.S. Cl.
CPC . *H03K 17/22* (2013.01); *G06F 1/24* (2013.01)

(58) Field of Classification Search
CPC ................ H03K 17/223; H03K 17/22; H03K 3/356008; G06F 1/24; G11C 5/143
USPC ................................. 327/141–143, 65, 77–79
See application file for complete search history.

(56) References Cited

U.S. PATENT DOCUMENTS

| 6,201,437 | B1 * | 3/2001 | Kono | ....................... | G05F 1/465 327/143 |
| 6,888,384 | B2 * | 5/2005 | Wada | .................... | H03K 17/223 327/143 |
| 8,405,429 | B2 * | 3/2013 | Numano | ................ | H03K 17/22 327/143 |
| 2009/0261885 | A1 | 10/2009 | Wada | | |

FOREIGN PATENT DOCUMENTS

| JP | 2000-269788 A | 9/2000 |
| JP | 2009-260804 A | 11/2009 |

* cited by examiner

*Primary Examiner* — Lincoln Donovan
*Assistant Examiner* — Diana J Cheng
(74) *Attorney, Agent, or Firm* — White & Case LLP

(57) ABSTRACT

A power-on reset circuit of one embodiment includes first and second power supplies, first and second detecting circuit, a differentiation circuit, a current mirror circuit and a latch circuit. The second power supply is generated from a voltage of the first power supply and supplies a voltage lower than the first power supply. The first detecting circuit detects rise of a voltage of the second power supply. A current corresponding to a change in potential of the first power supply flows through the differentiation circuit. The current mirror circuit multiplies the current flowing through the differentiation circuit. The second detecting circuit senses stoppage of output current of the current mirror circuit and detects completion of the rise of the voltage of the first power supply. The latch circuit is reset by an output signal of the first detecting circuit and set by an output signal of the second detecting circuit.

13 Claims, 7 Drawing Sheets

POWER-ON RESET CIRCUIT

CROSS-REFERENCE TO RELATED APPLICATION

This application is based upon and claims the benefit of priority from the prior Japanese Patent Application No. 2014-29151, filed on Feb. 19, 2014, the entire contents of which are incorporated herein by reference.

FIELD

The embodiments described hereinafter relate generally to a power-on reset circuit.

BACKGROUND

In a semiconductor integrated circuit, for example, in order to reduce power consumption, a voltage supplied from an external power supply is stepped down by a regulator etc., and an internal circuit is driven by a low voltage. In such a semiconductor integrated circuit, a power-on reset circuit which resets the internal circuit when power is turned on is incorporated in cases.

An integration circuit composed of a resistance and a capacitor is often used for the power-on reset circuit. The integration circuit is connected to a power supply line of an external power supply, and a terminal voltage of the capacitor is output as a power-on reset signal.

In the power-on reset circuit using an integration circuit, in a case that a rise of the external power supply is slow, a time constant of the integration circuit is required to be increased correspondingly. Accordingly, it is necessary to increase a resistance value of the resistance and a capacitance value of the capacitor, resulting in occurrence of a problem that a chip area of a semiconductor integrated circuit is increased.

DETAILED DESCRIPTION

Figure 1:
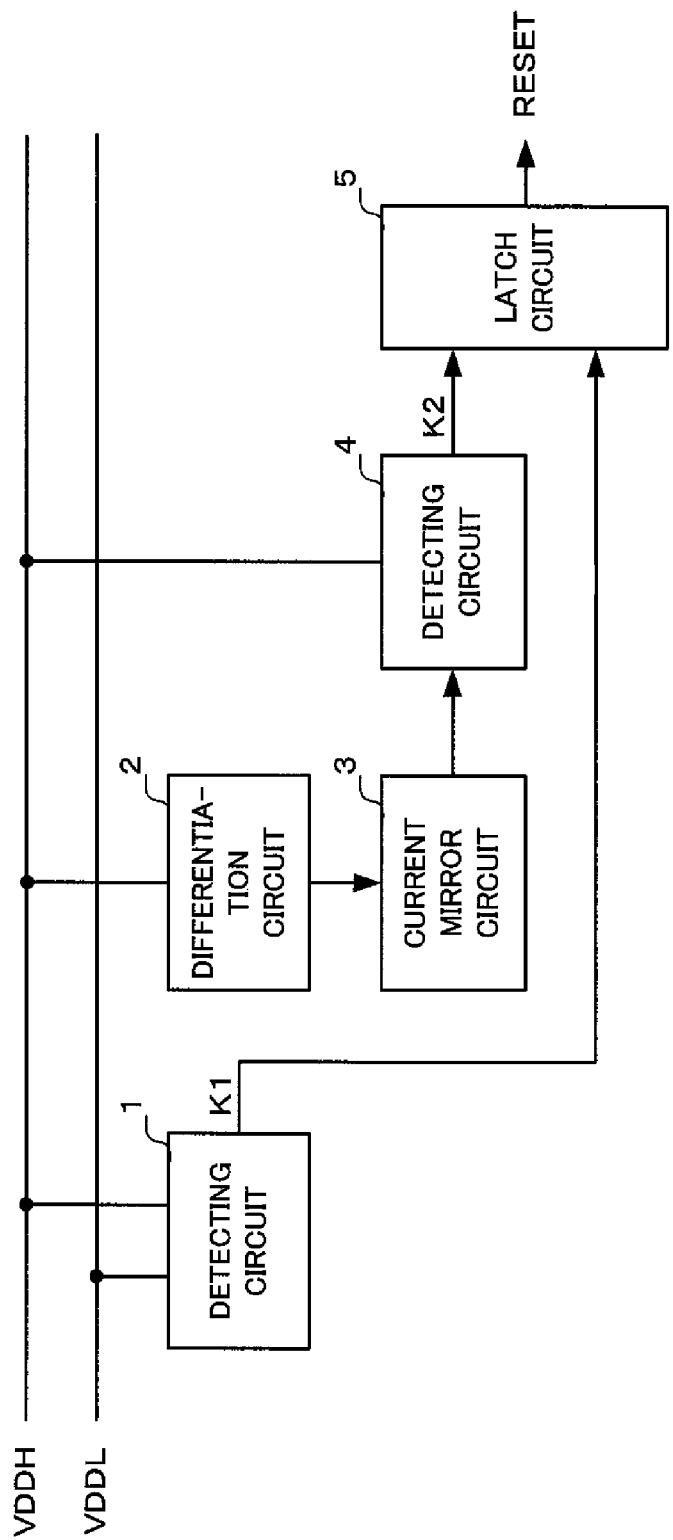
FIG. 1 is a block diagram showing a configuration of a power-on reset circuit according to an embodiment.

A power-on reset circuit of one embodiment includes a first power supply, a second power supply, a first detecting circuit, a differentiation circuit, a current mirror circuit, a second detecting circuit and a latch circuit. The second power supply supplies a voltage which is generated from a voltage of the first power supply and is lower than that of the first power supply. The first detecting circuit detects a rise of a voltage of the second power supply. A current corresponding to a change in potential of the first power supply flows through the differentiation circuit. The current mirror circuit multiplies the current flowing through the differentiation circuit. The second detecting circuit senses stoppage of an output current of the current mirror circuit and detects completion of the rise of the voltage of the first power supply. The latch circuit is reset by an output signal of the first detecting circuit and is set by an output signal of the second detecting circuit.

Hereinafter, further embodiments will be described with reference to the drawings. In the drawings, the same reference numerals denote the same or similar portions respectively.

FIG. 1 is a block diagram showing a configuration of a power-on reset circuit of an embodiment.

As shown in FIG. 1, the power-on reset circuit of the embodiment is provided with a power supply VDDH as a first power supply, a power supply VDDL as a second power supply, a detecting circuit 1 as a first detecting circuit, a differentiation circuit 2, a current mirror circuit 3, a detecting circuit 4 as a second detecting circuit, and a latch circuit 5.

A voltage of the power supply VDDL is generated from a voltage of the power supply VDDH and is lower than a voltage of the power supply VDDH. The detecting circuit 1 detects a rise of the power supply VDDL. A current corresponding to a change in potential of the power supply VDDH flows through the differentiation circuit 2.

The current mirror circuit 3 multiplies the current flowing through the differentiation circuit 2. The detecting circuit 4 senses stoppage of the output current of the current mirror circuit 3 and detects completion of the rise of the voltage of the power supply VDDH. The latch circuit 5 is reset by a detection signal K1 output from the detecting circuit 1 and is set by a detection signal K2 output from the detecting circuit 4.

The power supply VDDH supplies a voltage from outside, for example, and the power supply VDDL supplies a voltage generated from the power supply VDDH by a step-down regulator, for example. Accordingly, the voltage of the power supply VDDL is lower than that of the power supply VDDH. When the power supply VDDH is activated, the power supply VDDL rises with a delay from the rise of the power supply VDDH.

Figure 2:
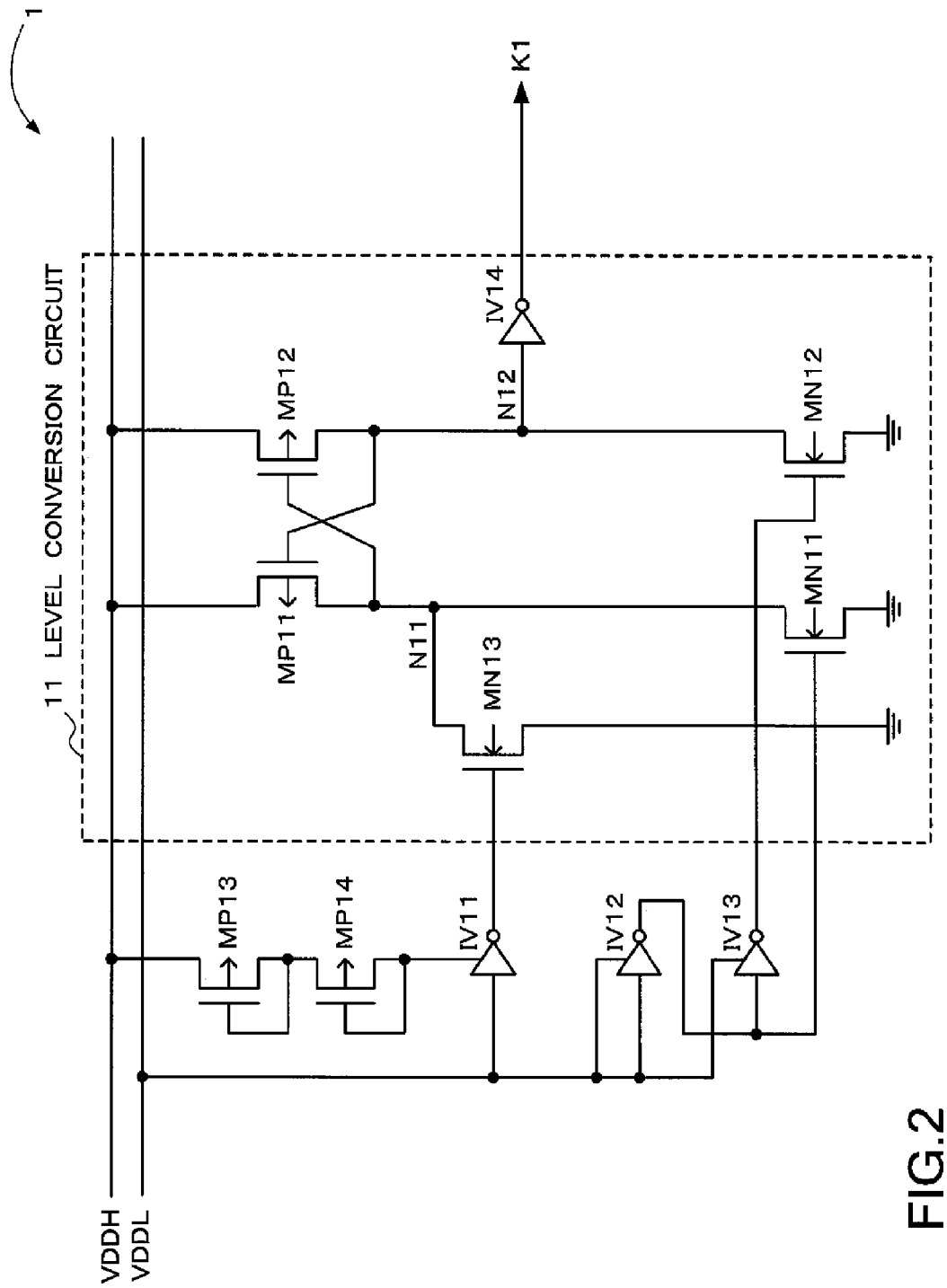
FIG. 2 is a circuit diagram showing an example of an internal configuration of a detecting circuit shown in FIG. 1.
Figure 3:
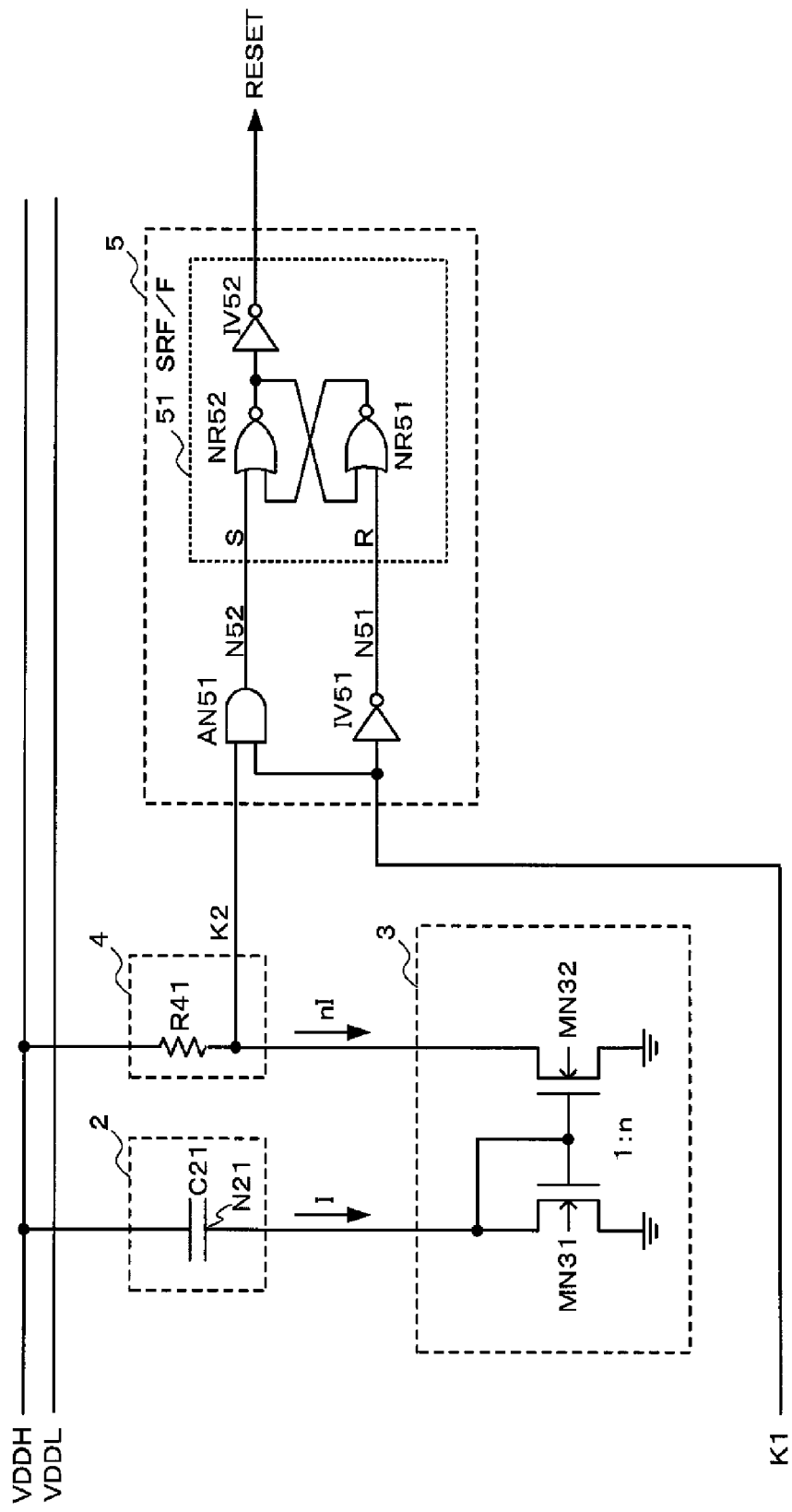
FIG. 3 is a circuit diagram showing an example of internal configurations of circuits including a differentiation circuit, a current mirror circuit, a detecting circuit and a latch circuit shown in FIG. 1.

FIGS. 2 and 3 show examples of internal configurations of the blocks shown in FIG. 1. FIG. 2 is a circuit diagram showing an example of an internal configuration of the detecting circuit 1. FIG. 3 is a circuit diagram showing an example of internal configurations of the differentiation circuit 2, the current mirror circuit 3, the detecting circuit 4 and the latch circuit 5.

The example of the internal configuration of the detecting circuit 1 shown in FIG. 2 will be described.

The detecting circuit 1 includes inverters IV11 to IV13 and a level conversion circuit 11. A series circuit of diode-connected P-channel insulated gate field effect transistors (hereinafter referred to as "PMOS transistors") MP13, MP14 is connected between the inverter IV11 and the power supply VDDH. In the inverter IV11, a voltage which is obtained by stepping down the voltage of the power supply VDDH by the PMOS transistors MP13, MP14 is used as a power supply voltage, and the voltage of the power supply VDDL is used as an input signal. The inverter IV12 is connected to the power supply VDDL to use the voltage of the power supply VDDL as a power supply voltage. In the inverter IV12, the voltage of the power supply VDDL is used as an input signal. The inverter IV13 is connected to the power supply VDDL to use the voltage of the power supply VDDL as a power supply voltage. The inverter IV13 receives an output from the inverter IV12 as an input signal and output an output signal. The level conversion circuit 11 raises levels of the output signals from the inverters IV12, IV13 to a voltage level VDDH of the power supply VDDH.

Since the power supply voltage of the inverter IV11 is a voltage stepped down from the power supply VDDH, a threshold value of the inverter IV11 is set to be lower than that to be set when the inverter IV11 is directly driven by the power supply VDDH.

The power supply voltages of the inverters IV12, IV13 are the voltage of the power supply VDDL. Accordingly, each output signal level of the inverters IV12, IV13 is a voltage level of the power supply VDDL.

The level conversion circuit 11 is provided with PMOS transistors MP11, MP12, a N-channel insulated gate field effect transistor (hereinafter referred to as "NMOS transistor") MN11, and an NMOS transistor MN12. Each source of the PMOS transistors MP11, MP12 is connected to the power supply VDDH. A source of the NMOS transistor MN11 is connected to a ground terminal, and a drain of the NMOS transistor MN11 is connected to a drain of a PMOS transistor MP11. A source of the NMOS transistor MN12 is connected to a ground terminal, and a drain of the NMOS transistor MN12 is connected to a drain of a PMOS transistor MP12.

A gate of the PMOS transistor MP11 is connected to a node N12 which is a connection point between the drain of the PMOS transistor MP12 and the drain of the NMOS transistor MN12.

A gate of the PMOS transistor MP12 is connected to a node N11 which is a connection point between the drain of the PMOS transistor MP11 and the drain of the NMOS transistor MN11.

An output signal of the inverter IV12 is input to a gate of the NMOS transistor MN11, and the output signal of the inverter IV13 is input to a gate of the NMOS transistor MN12.

Each signal of a VDDL level output from the inverters IV12, IV13 is converted into a VDDH level and output to the node N12.

An input terminal of the inverter IV14 is connected to the node N12, and the output signal of the inverter IV14 is the detection signal K1 which is the output signal of the detecting circuit 1.

The level conversion circuit 11 has an NMOS transistor MN13 connected between the node N11 and a ground terminal.

The output signal of the inverter IV 11 is input to a gate of the NMOS transistor MN13. An output level of the inverter IV11 is a voltage level of the power supply VDDH at the beginning of a rise of the power supply VDDH. Accordingly, at this time, the NMOS transistor MN13 is in an ON state.

At this time, the voltage of the power supply VDDL is still low and is near a ground potential. Thus, outputs of the inverters IV12, IV13 are at a ground potential level substantially, and the NMOS transistors MN11, MN12 are in an OFF state.

Accordingly, the NMOS transistor MN13 is turned on at the beginning of the rise of the power supply VDDH so that the node N11 is set to a ground potential. Since the node N11 is set to the ground potential, the PMOS transistor MP12 is turned on, and the node N12 is set to a voltage level of the power supply VDDH.

As described above, the NMOS transistor MN13 is turned on at the beginning of the rise of the power supply VDDH so that the initial states of the node N11, N12 are determined.

FIG. 3 shows internal configurations of circuits including a differentiation circuit 2, a current mirror circuit 3, a detecting circuit 4, and a latch circuit 5.

The differentiation circuit 2 has a capacitor C21. One end of the capacitor C21 is connected to the power supply VDDH, and the other end of the capacitor C21 is a node N21 which is a connection point with the current mirror circuit 3. A current corresponding to gradient of a change in potential of the power supply VDDH flows through the capacitor C21 when the power supply VDDH rises.

The current mirror circuit 3 is provided with NMOS transistors MN31, MN32. A source of the NMOS transistor MN31 is connected to a ground terminal, and a drain and a gate of the NMOS transistor MN31 are connected to the node N21 of the differentiation circuit 2. A source of the NMOS transistor MN32 is connected to a ground terminal, and a gate of the NMOS transistor MN32 is connected to the gate of the NMOS transistor MN31.

The size ratio of the NMOS transistors MN31, MN32 is 1:n (n>1) so that the mirror ratio is set to "n". Accordingly, when the magnitude of a current input to the NMOS transistor MN31 is I, the magnitude of an output current (mirror current) flowing through the NMOS transistor MN32 is nI.

The detecting circuit 4 has a resistance R41 connected between the power supply VDDH and a drain of the NMOS transistor MN32 of the current mirror circuit 3. A voltage at a connection point between the resistance R41 and the drain of the NMOS transistor MN32 is output as the detection signal K2.

The latch circuit 5 includes a set-reset type flip-flop (hereinafter referred to as an "SR F/F") 51, an inverter IV51, and a two-input AND gate AN51. An output terminal of the inverter IV51 is connected to an R (reset) terminal of the SR F/F 51, and the detection signal K1 is input to an input terminal of the inverter IV51. An output terminal of the AND gate AN51 is connected to an S (set) terminal of the SR F/F 51, and the detection signal K1 and the detection signal K2 are input respectively to two input terminals of the AND gate AN51.

As a circuit example of the SR F/F 51, FIG. 3 shows an example configured by a circuit in which input/output terminals of an NOR gate NR51 and input/output terminals of an NOR gate NR52 are cross-connected, and an inverter IV52 connected to the output terminal of the NOR gate NR52.

In this case, the input terminal of the NOR gate NR51 is an R terminal and is connected to an output terminal of the inverter IV51. The input terminal of the NOR gate NR52 is an S terminal and is connected to the output terminal of the AND gate AN 51. An output of the inverter IV52 is an output signal of the latch circuit 5.

The configuration of the SR F/F 51 is not limited to the example shown in FIG. 3. For example, the SR F/F 51 may be configured by using a NAND gate etc., for example.

In the circuit example of FIG. 3, an output signal N51 of the inverter IV51 is input to an R terminal of the SR F/F 51, and an output signal N52 of the AND gate AN 51 is input to an S terminal of the SR F/F 51.

An output of the SR F/F 51 is a power-on reset signal RESET.

An operation of the circuits shown in FIGS. 2, 3 at the time of turning on the power supply VDDH will be described by using FIGS. 4A, 4B. The time required for the rise of the power supply VDDH is different between FIGS. 4A and 4B. FIG. 4B shows a case where the rise of the power supply VDDH is slower than that in FIG. 4A.

Figure 4A:
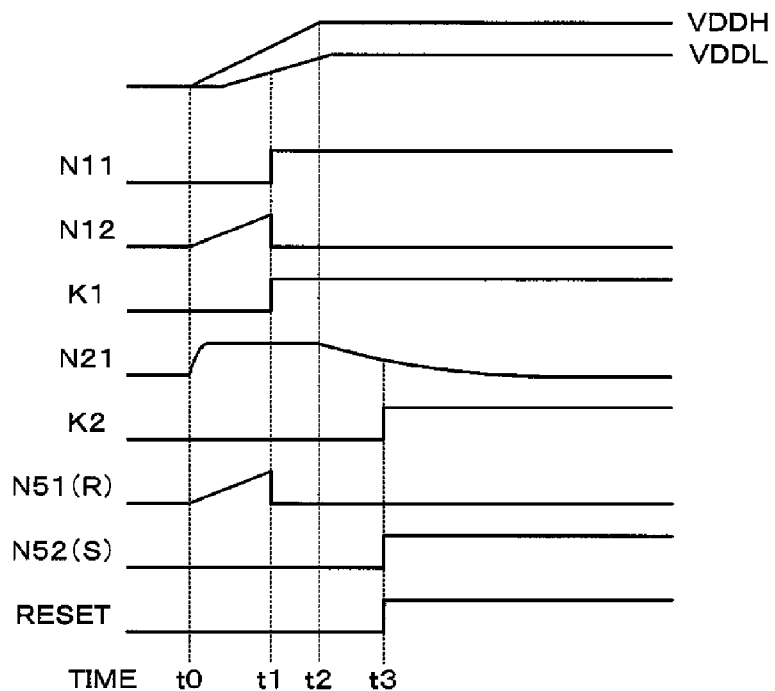
FIGS. 4A and 4B are waveform charts showing an example of operation of the power-on reset circuit of the embodiment.
Figure 4B:
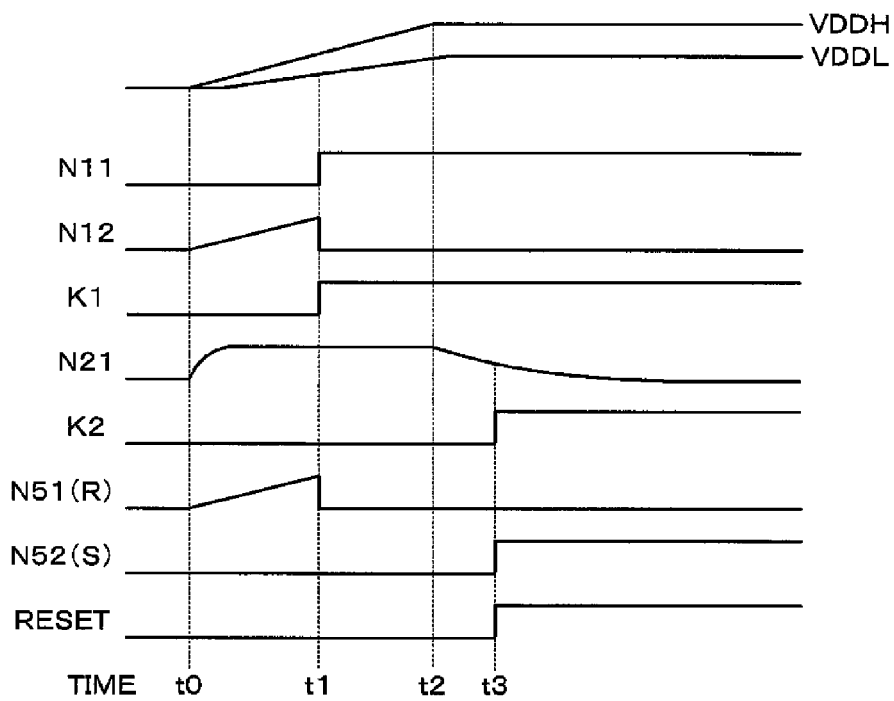

As shown in FIG. 4A, when the power supply VDDH is turned on at time t0, the voltage of the power supply VDDH starts to rise. Since the power supply VDDL is generated by stepping down the voltage of the power supply VDDH, the power supply VDDL starts to rise with a delay from the rise of the power supply VDDH.

During a period from the start of the rise of the power supply VDDH to the start of the rise of the power supply VDDL, an output of the inverter IV11 of the detecting circuit 1 of FIG. 2 is a voltage level obtained by dropping the power supply VDDH, and the outputs of the inverters IV12, IV13 are at a ground level. Accordingly, the NMOS transistor MN13 is turned on, and the NMOS transistors MN11, MN12 are in an OFF state.

During the period, the node N11 of the level conversion circuit 11 is at a ground level, and a node N12 is at the VDDH level. The potential of the node N12 rises according to the rise of the power supply VDDH.

Accordingly, the detection signal K1 which is an output of the inverter IV14 inverting the level of the node N12 is at a ground potential level.

At the rise of the power supply VDDH, the current I flows through the capacitor C21 of the differentiation circuit 2 shown in FIG. 3, and the potential of the node N21 rises.

The current I flowing into the current mirror circuit 3 from the capacitor C21 is multiplied by n times by the current mirror circuit 3, and a current nI flows through the resistance 41 of the detecting circuit 4 connected to an output of the current mirror circuit 3.

The detection signal K2 output from the detecting circuit 4 is at the ground potential level due to a voltage drop of the resistance 41 by the current nI.

As shown in FIGS. 1 and 3, the detection signals K1, K2 are input to the latch circuit 5. More specifically, the detection signal K1 is input to the inverter IV51 of the latch circuit 5, and the detection signals K1, K2 is input to the AND gate AN51 of the latch circuit 5.

As described above, the detection signals K1, K2 are at the ground potential level at the beginning of the rise of the power supply VDDH. Accordingly, the output of the inverter IV51 of FIG. 3 is at the voltage level of the power supply VDDH, and the output of the AND gate AN51 is at the ground potential level.

As described above, the output of the inverter IV51 is the reset signal of the SR F/F 51, and the output of the AND gate AN51 is the set signal of the SR F/F 51.

Accordingly, the SR F/F 51 is reset at the beginning of the rise of the power supply VDDH, and the power-on reset signal RESET which is an output signal of the SR F/F 51 is at the ground potential level.

Then, the voltage of the power supply VDDL starts to rise, and when the potential of the power supply VDDL exceeds a threshold value of the inverter IV11 of the detecting circuit 1 shown in FIG. 2, the output of the inverter IV11 is inverted to a ground potential level, and the NMOS transistor MN13 is turned off.

When the inverters IV12, IV13 using the voltage of the power supply VDDL as a power supply voltage are in an active state at the time t1, the output of the inverter IV12 is at a ground potential level, and the output of the inverter IV13 is at a voltage level of the power supply VDDL.

Consequently, the NMOS transistor MN11 of the level conversion circuit 11 maintains the OFF state, and the NMOS transistor MN12 changes to an ON state.

Since the NMOS transistor MN12 is turned on, the potential of the node N12 of the level conversion circuit 11 changes to the ground potential level. The potential of the node N11 changes to the voltage level of the power supply VDDH.

Accordingly, the detection signal K1 which is output from the detecting circuit 1 shown in FIG. 2 at time t1 changes to a VDDH level. The output of the inverter IV51 which is the reset signal of the SR F/F 51 of FIG. 3 is at the ground potential level.

During the period, since current continues to flow through the capacitor C21 of the differentiation circuit 2, the detection signal K2 output from the detecting circuit 4 maintains the ground potential level.

Accordingly, the output of the AND gate AN51 which is the set signal of the SR F/F 51 maintains the ground potential level.

In the above state, the power-on reset signal RESET which is the output of the SR F/F 51 is held at the ground potential level.

Then, as shown in FIG. 4, when the rise of the power supply VDDH is completed at time t3, current does not flow through the capacitor C21 of the differentiation circuit 2 shown in FIG. 3. Thus, the potential of the node N21 of the differentiation circuit 2 starts to drop due to self-discharge of the NMOS transistor MN31. When the dropping of the potential reaches threshold values of the NMOS transistors MN31, MN32, the NMOS transistors MN31, MN32 are turned off so that current does not flow through the output of the current mirror circuit 3.

Consequently, current does not flow through the resistance 41 of the detecting circuit 4 of FIG. 3, and the detection signal K2 output from the detecting circuit 4 changes to the voltage level of the power supply VDDH.

Due to the change of the voltage level, the output of the AND gate AN51 which is the set signal of the SR F/F 51 of the latch circuit 5 changes to the VDDH level, and the power-on reset signal RESET which is the output of the SR F/F 51 changes to the VDDH level.

In the present embodiment, the power-on reset signal RESET maintains the ground potential level until the detection signal K2 changes to the VDDH level after the completion of the rise of the power supply VDDH.

The above operation is the same as in the case where the rise of the power supply VDDH is slow as shown in FIG. 4B.

As shown in FIG. 4B, when the rise of the power supply VDDH is slow, a current flowing through the capacitor C21 of the differentiation circuit 2 of FIG. 3 is small, and thus the rise of the potential of the node N21 of the differentiation circuit 2 is slow. However, in the embodiment, since the current flowing through the capacitor C21 is multiplied by the current mirror circuit 3, the mirror ratio "n" is set sufficiently large so that the current flowing through the resistance 41 of the detecting circuit 4 can be sufficiently increased. Accordingly, a voltage drop due to the resistance 41 is sufficiently increased, and the detection signal K2 at the time of the rise of the power supply VDDH can be set at the ground potential level.

Rise of the detection signal K2 in FIG. 4B is determined by a drop of the potential of the node 21 due to the self-discharge of the NMOS transistor MN 31 as in the case of FIG. 4A. The detection signal K2 rises at the time t3 as in the case of FIG. 4A. The detection signal K2 rises so that the power-on reset signal RESET changes to the VDDH level.

In the embodiment, even when the rise of the power supply VDDH is slow, a period during which the power-on reset signal RESET is at the ground potential level can be sufficiently secured without increasing the capacitance of the capacitor C21.

Figure 5:
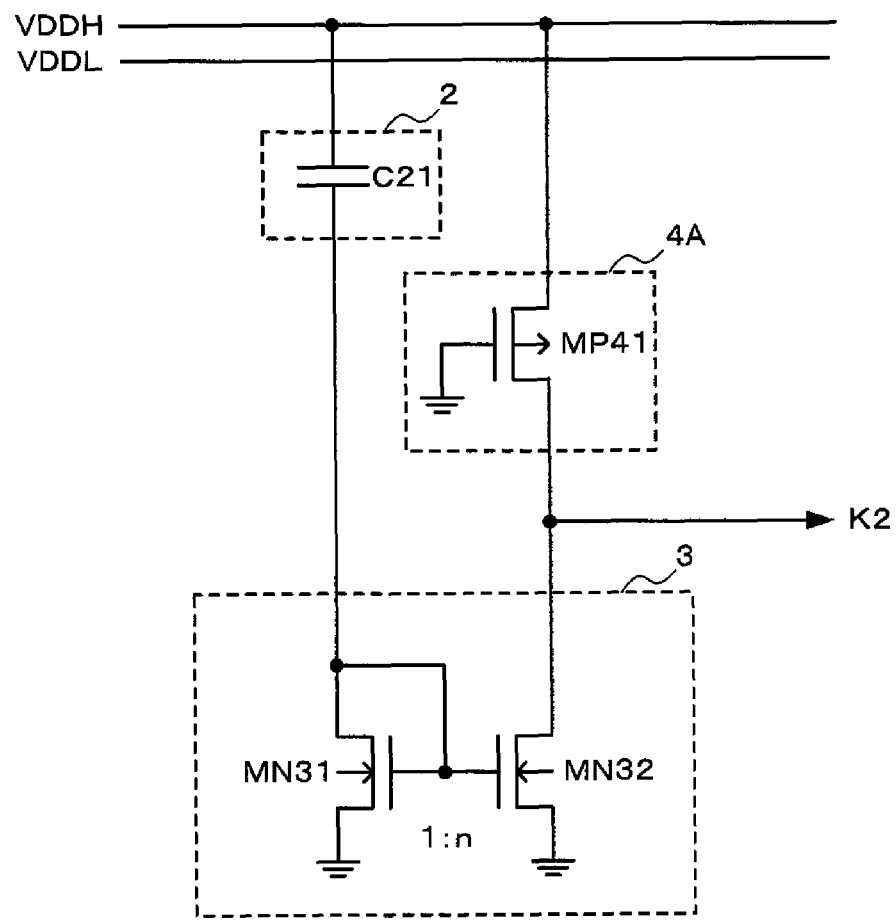
FIG. 5 is a circuit diagram showing another example of internal configurations of circuits including the differentiation circuit, the current mirror circuit and the detecting circuit shown in FIG. 1.
Figure 6:
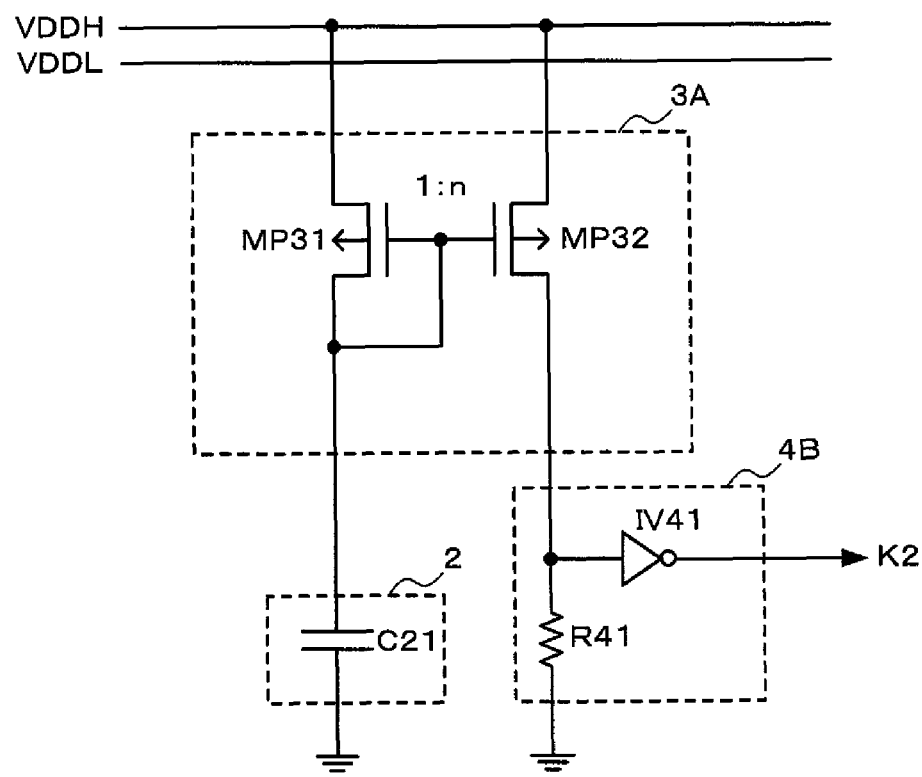
FIG. 6 is a circuit diagram showing still another example of internal configurations of circuits including the differentiation circuit, the current mirror circuit and the detecting circuit shown in FIG. 1.
Figure 7:
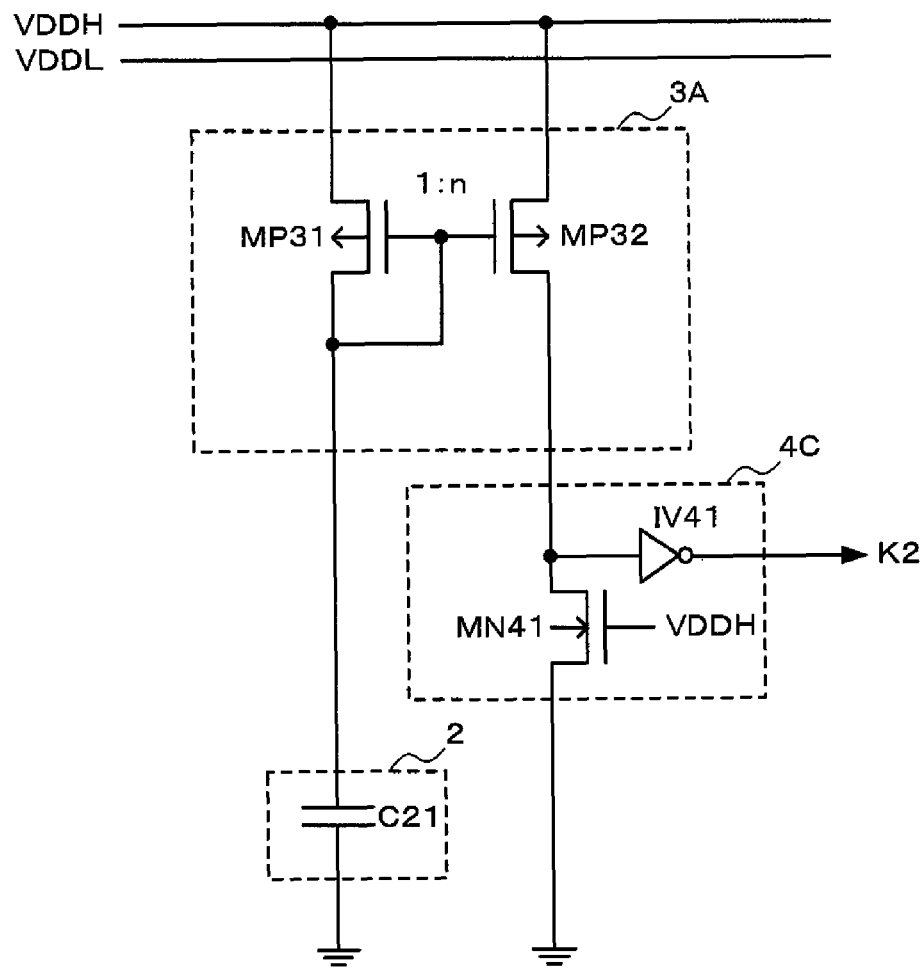
FIG. 7 is a circuit diagram which shows further another example of internal configurations of circuits including the differentiation circuit, the current mirror circuit and the detecting circuit shown in FIG. 1.

FIGS. 5 to 7 show other examples of the internal configurations of circuits including the differentiation circuit 2, the current mirror circuit 3 and the detecting circuit 4 shown in FIG. 1.

In the example of FIG. 5, a detecting circuit 4A as the second detecting circuit is used instead of the detecting circuit 4 shown in FIG. 3. In the detecting circuit 4A, a PMOS transistor MP41 is used instead of the resistance R41 of the detecting circuit 4.

A gate of the PMOS transistor MP41 is connected to a ground terminal. Accordingly, the PMOS transistor MP41 is always turned on, and an on-resistance of the PMOS transistor MP41 is used instead of the resistance R41.

In the example shown in FIG. 6, a current mirror circuit 3A including two PMOS transistors MP31, MP32 is used instead of the current mirror circuit of FIG. 3. The differentiation circuit 2 and the detecting circuit 4B as the second detecting circuit are connected between the current mirror circuit 3A and a ground terminal, respectively.

More specifically, sources of the PMOS transistors MP31, MP32 of the current mirror circuit 3A shown in FIG. 6 are connected to the power supply VDDH, and a drain and a gate of the PMOS transistor MP31 are connected to the capacitor 21 of the differentiation circuit 2. A source of the PMOS transistor MP32 is connected to the power supply VDDH, a drain of the PMOS transistors MP32 is connected to the resistance R41 of the detecting circuit 4B, and a gate of the PMOS transistor MP32 is connected to the gate of the PMOS transistor MP31.

The size ratio of the PMOS transistors MP31, MP32 is set to 1:n (n>1).

The current mirror circuit 3A multiplies the current flowing through the capacitor C21 of the differentiation circuit 2 by "n" times, and flows the current through the resistance R41 of the detecting circuit 4B.

In the detecting circuit 4B, a voltage which is produced at a terminal of the resistance R41 on a side of the power supply VDDH has a polarity opposite to that of the detecting circuit 4. Thus, in the detecting circuit 4B, the output level of the terminal of the resistance R41 is inverted by an inverter IV41. The output of the inverter IV41 is the detection signal K2.

In the example shown in FIG. 7, a detecting circuit 4C is used as the second detecting circuit instead of the detecting circuit 4B shown in FIG. 6. In the detecting circuit 4C, the resistance R41 of the detecting circuit 4B shown in FIG. 6 is replaced by an NMOS transistor MN41.

A gate of the NMOS transistor MN41 is connected to the power supply VDDH. Accordingly, the NMOS transistor MN41 is always turned on, and an on-resistance of the NMOS transistor MN41 is used instead of the resistance R41 of the detecting circuit 4B.

According to the above embodiment, a capacitor is used as a differentiation circuit through which current flows when a voltage of a power supply VDDH rises. The current flowing through the capacitor is multiplied by a current mirror circuit. Accordingly, even when the rise of the power supply VDDH is slow, the rise of the power supply VDDH can be detected without increasing the capacitance of the capacitor, and a reset period of a power-on reset signal can be sufficiently secured. Since the capacitance of the capacitor may not be increased, increase of a chip area required for forming the capacitor can be suppressed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. For example, other logic circuits may be used instead of the inverters IV11 to IV13.

What is claimed is:

1. A power-on reset circuit comprising:
   a first power supply;
   a second power supply which is generated from a voltage of the first power supply and supplies a voltage lower than that of the first power supply;
   a first detecting circuit which detects a rise of a voltage of the second power supply;
   a differentiation circuit through which a current corresponding to a change in potential of the first power supply flows;
   a current mirror circuit which multiplies the current flowing through the differentiation circuit;
   a second detecting circuit which senses stoppage of an output current of the current mirror circuit and detects completion of a rise of the voltage of the first power supply; and
   a latch circuit which is reset by an output signal of the first detecting circuit and is set by an output signal of the second detecting circuit.

2. The power-on reset circuit according to claim 1, wherein the first detecting circuit includes:
   a first logic circuit which uses a voltage obtained by stepping down the voltage of the first power supply as a power supply voltage and receives the voltage of the second power supply as an input signal;
   a second logic circuit which uses the voltage of the second power supply as a power supply voltage and receives a signal corresponding to the voltage of the second power supply as an input signal; and
   a level conversion circuit, an initial state of the level conversion circuit being determined by an output signal of the first logic circuit, output signal level of the level conversion circuit being increased to a voltage level of the first power supply by an output signal of the second logic circuit.

3. The power-on reset circuit according to claim 2, further comprising a third logic circuit which uses the voltage of the second power supply as a power supply voltage and receives the voltage of the second power supply as an input signal, wherein the second logic circuit receives an output from the third logic circuit as the input signal to the second logic circuit.

4. The power-on reset circuit according to claim 3, wherein the level conversion circuit includes:
   first and second transistors having first conductivity channels which have sources connected to the first power supply, and gates connected to drains of the second and first transistors respectively;
   a third transistor having a second conductivity channel which have a gate connected to an output terminal of the first logic circuit, a drain connected to the drain of the first transistor, and a source to be grounded;
   a fourth logic circuit, an input terminal of the fourth logic circuit being connected to the drain of the second transistor; and
   fourth and fifth transistors having second conductivity channels which have gates connected respectively to the output terminals of the second and the third logic circuits, drains connected respectively to the drains of the first and second transistors, and sources to be grounded.

5. The power-on reset circuit according to claim 4, wherein the first to the fourth logic circuits are inverters.

6. The power-on reset circuit according to claim 5, wherein the differentiation circuit is a capacitor connected between the first power supply and the current mirror circuit, and the second detecting circuit is a resistance connected between the first power supply and the current mirror circuit.

7. The power-on reset circuit according to claim 6, wherein the resistance is composed of an MOS transistor.

8. The power-on reset circuit according to claim 1, wherein the current mirror circuit includes sixth and seventh transistors having second conductivity channels which have gates respectively connected to each other, sources to be grounded and drains connected respectively to the differentiation circuit and the second detecting circuit, and the gate and the drain of the sixth transistor are connected to each other.

9. The power-on reset circuit according to claim 1, wherein the latch circuit includes:
   an AND gate connected to an output terminal of the second detecting circuit and an output terminal of the fourth logic circuit;
   a fifth logic circuit connected to the output terminal of the fourth logic circuit; and
   an SR flip-flop which is reset by an output signal of the AND gate and is set by an output signal of the fifth logic circuit.

10. The power-on reset circuit according to claim 9, wherein the fifth logic circuit is an inverter.

11. The power-on reset circuit according to claim 1, wherein the current mirror circuit includes eighth and ninth transistors having first conductivity channels which have gates connected to each other, drains connected to the first power supply and sources connected respectively to the differentiation circuit and the second detecting circuit, and the gate and the drain of the eighth transistor are connected to each other.

12. The power-on reset circuit according to claim 11, wherein the differentiation circuit is a capacitor to be connected between the current mirror circuit and a ground, and the second detecting circuit is a resistance to be connected between the current mirror circuit and the ground.

13. The power-on reset circuit according to claim 12, wherein the resistance is composed of a MOS transistor.

\* \* \* \* \*